United States Patent
Choi et al.

(10) Patent No.: US 9,371,444 B2
(45) Date of Patent: Jun. 21, 2016

(54) HARDMASK COMPOSITION AND METHOD OF FORMING PATTERNS USING THE HARDMASK COMPOSITION

(71) Applicant: SAMSUNG SDI CO., LTD., Yongin-si, Gyeonggi-do (KR)

(72) Inventors: Yoo-Jeong Choi, Suwon-si (KR); Yun-Jun Kim, Suwon-si (KR); Young-Min Kim, Suwon-si (KR); Joon-Young Moon, Suwon-si (KR); Yu-Shin Park, Suwon-si (KR); Hyun-Ji Song, Suwon-si (KR); Yong-Woon Yoon, Suwon-si (KR); Chung-Heon Lee, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/602,856

(22) Filed: Jan. 22, 2015

(65) Prior Publication Data
US 2015/0329718 A1   Nov. 19, 2015

(30) Foreign Application Priority Data

May 16, 2014  (KR) .......................... 10-2014-0059253
Nov. 24, 2014 (KR) .......................... 10-2014-0164605

(51) Int. Cl.
| | |
|---|---|
| *C08L 65/00* | (2006.01) |
| *H01L 21/308* | (2006.01) |
| *H01L 21/314* | (2006.01) |
| *H01L 21/3213* | (2006.01) |
| *H01L 21/311* | (2006.01) |

(52) U.S. Cl.
CPC ............. *C08L 65/00* (2013.01); *H01L 21/3081* (2013.01); *H01L 21/3086* (2013.01); *H01L 21/31144* (2013.01); *H01L 21/32139* (2013.01)

(58) Field of Classification Search
None
See application file for complete search history.

(56) References Cited

U.S. PATENT DOCUMENTS

| | | | | | |
|---|---|---|---|---|---|
| 7,816,067 | B2 * | 10/2010 | Enomoto | .................. | G03F 7/11 430/270.1 |
| 8,592,956 | B2 * | 11/2013 | Ogihara | .................. | G03F 7/091 257/643 |
| 8,877,422 | B2 * | 11/2014 | Ogihara | .................. | G03F 7/091 430/270.1 |
| 2014/0186777 | A1 * | 7/2014 | Lee | .......................... | C07C 33/26 430/325 |
| 2014/0235059 | A1 * | 8/2014 | Sakamoto | .............. | C08G 12/08 438/702 |

FOREIGN PATENT DOCUMENTS

| | | | |
|---|---|---|---|
| JP | 2007-199653 | * | 8/2007 |
| JP | 2012-145897 | * | 8/2012 |
| JP | 2013-156627 | * | 8/2013 |

(Continued)

OTHER PUBLICATIONS

Machine translation of JP 2007-199653 (41 pages) (Aug. 2007).*

(Continued)

*Primary Examiner* — Martin Angebranndt
(74) *Attorney, Agent, or Firm* — Lee & Morse, P.C.

(57) ABSTRACT

A hardmask composition and a method of forming patterns, the composition including a solvent; and a polymer including a moiety represented by the following Chemical Formula 1,

[Chemical Formula 1]

$$*\text{---}[(M^1)_a\text{---}(M^2)_b]\text{---}*.$$

14 Claims, 1 Drawing Sheet

Step Difference = (h0-h1) + (h0-h2) + (h0-h3) + (h0-h4)
(Sum/nm)

(56) References Cited

FOREIGN PATENT DOCUMENTS

| KR | 10-2008-0107208 A | 12/2008 |
| KR | 10-2010-0080139 A | 7/2010 |
| KR | 10-2010-0080148 A | 7/2010 |
| KR | 10-2011-0084901 A | 7/2011 |
| KR | 10-2012-0026993 A | 3/2012 |
| KR | 10-2012-0077466 A | 7/2012 |
| KR | 10-2014-0083844 A | 7/2012 |
| KR | 2012-0073817 | * 7/2012 |
| KR | 2013-0026912 | * 3/2013 |
| KR | 10-2013-0078429 A | 7/2013 |
| KR | 10-2013-0078432 A | 7/2013 |

OTHER PUBLICATIONS

Search Report mailed Oct. 28, 2015 in corresponding Taiwanese Patent Application No. 104107106.

* cited by examiner

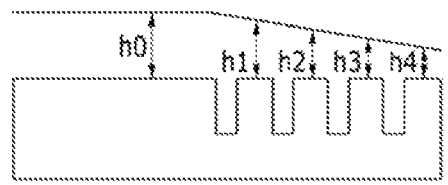

HARDMASK COMPOSITION AND METHOD OF FORMING PATTERNS USING THE HARDMASK COMPOSITION

CROSS-REFERENCE TO RELATED APPLICATIONS

Korean Patent Application No. 10-2014-0059253, filed on May 16, 2014, in the Korean Intellectual Property Office, and Korean Patent Application No. 10-2014-0164605, filed on Nov. 24, 2014, in the Korean Intellectual Property Office, and entitled: "Hardmask Composition and Method of Forming Patterns Using the Hardmask Composition," are incorporated by reference herein in their entirety.

BACKGROUND

1. Field

Embodiments relate to a hardmask composition and a method of forming patterns using the hardmask composition.

2. Description of the Related Art

An ultra-fine technique may form a pattern of several to several tens nanometer size. Such an ultrafine technique may utilize effective lithographic techniques. A lithographic technique may include providing a material layer on a semiconductor substrate; coating a photoresist layer thereon; exposing and developing the same to provide a photoresist pattern; and etching the material layer using the photoresist pattern as a mask.

SUMMARY

Embodiments are directed to a hardmask composition and a method of forming patterns using the hardmask composition.

The embodiments may be realized by providing a hardmask composition including a solvent; and a polymer including a moiety represented by the following Chemical Formula 1,

[Chemical Formula 1]

wherein, in the above Chemical Formula 1, a is 0 or 1, and b is an integer of 1 to 3, $M^1$ is represented by one of the following Chemical Formula 2a or 2b, and $M^2$ is represented by one of the following Chemical Formula 3a or 3b:

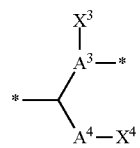
[Chemical Formula 2a]

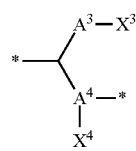
[Chemical Formula 2b]

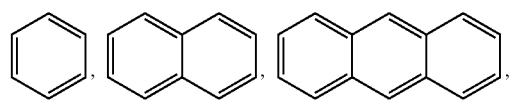
[Chemical Formula 3a]

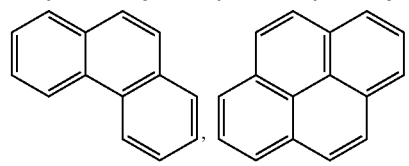
[Chemical Formula 3b]

wherein, in the above Chemical Formulae 2a, 2b, 3a, and 3b, $A^1$ to $A^4$ are each independently an aliphatic cyclic group or an aromatic ring group, $X^1$ to $X^4$ are each independently hydrogen, a hydroxy group, a cyano group, a thiol group, an amino group, a halogen, a halogen-containing group, or a combination thereof, and * represents a binding site to a neighboring atom.

$A^1$ to $A^4$ may each independently be a substituted or unsubstituted group selected from the following Group 1:

[Group 1]

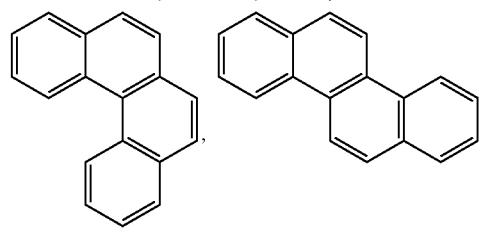

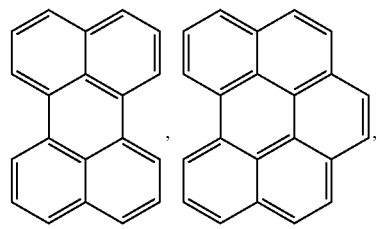

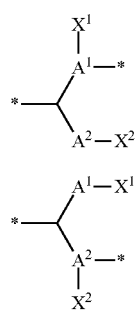

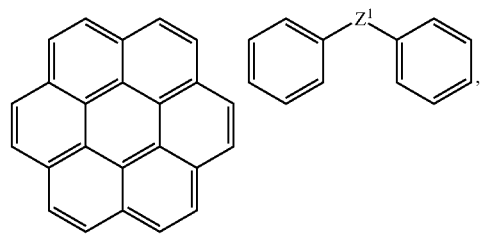

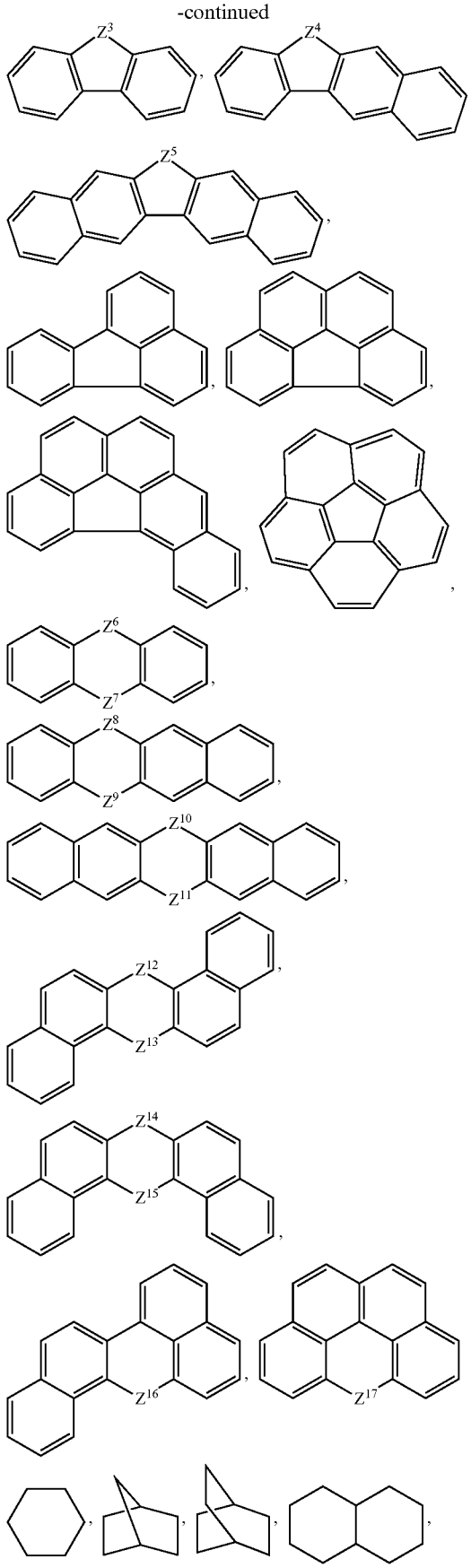

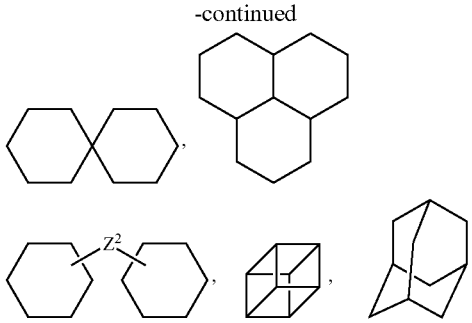

wherein, in Group 1, $Z^1$ and $Z^2$ may each independently be a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen, sulfur, or a combination thereof, in which $R^a$ is hydrogen, a substituted or unsubstituted C1 to C10 alkyl group, a halogen, or a combination thereof, and $Z^3$ to $Z^{17}$ may each independently be C=O, $NR^d$, oxygen, sulfur, $CR^bR^c$, or a combination thereof, in which $R^b$ to $R^d$ are each independently hydrogen, a substituted or unsubstituted C1 to C10 alkyl group, a halogen, a halogen-containing group, or a combination thereof.

a may be 1, and $M^1$ and $M^2$ may each independently include at least one polycyclic aromatic group.

a may be 1, and $M^1$ may have a larger molecular weight than $M^2$.

The polymer may include a moiety represented by the following Chemical Formula 4:

$$X^0\text{-}M^2\text{-}[\text{-}(M^1)_l\text{-}(M^2)_m\text{-}]_n* \qquad \text{[Chemical Formula 4]}$$

wherein, in the above Chemical Formula 4, $M^1$ and $M^2$ may be the same as described with respect to Chemical Formula 1, $X^0$ may be a hydroxy group, a cyano group, a thiol group, an amino group, a halogen, a halogen-containing group, or a combination thereof, l may be 0 or 1, m may be an integer of 1 to 3, and n may be an integer of 1 to 10.

$M^1$ may be represented by one of the following Chemical Formula 2-1a, 2-1b, 2-2a, 2-2b, 2-3a, or 2-3b:

[Chemical Formula 2-1a]

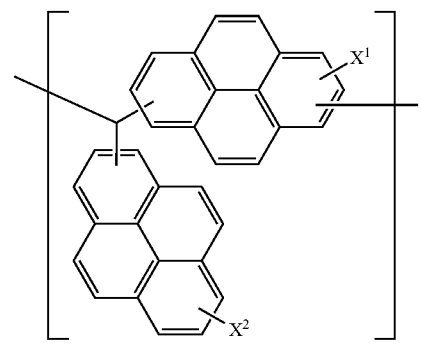

[Chemical Formula 2-1b]

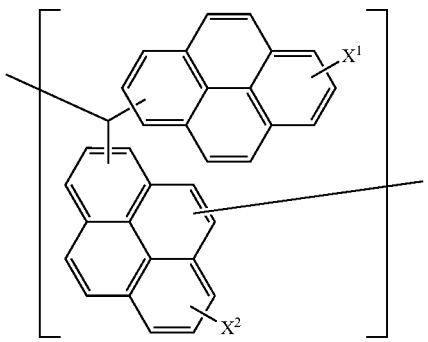

[Chemical Formula 2-2a]

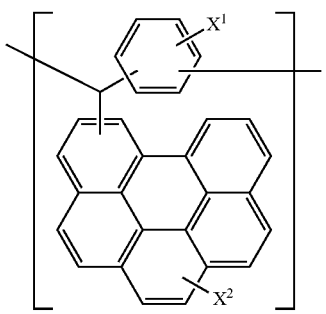

[Chemical Formula 2-2b]

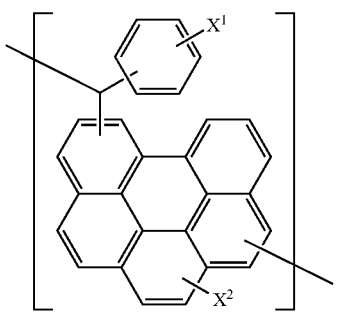

[Chemical Formula 2-3a]

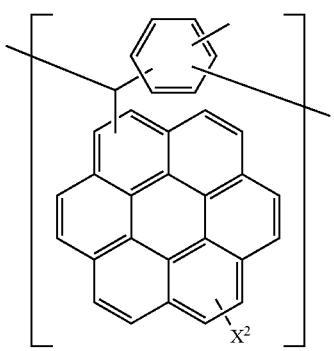

[Chemical Formula 2-3b]

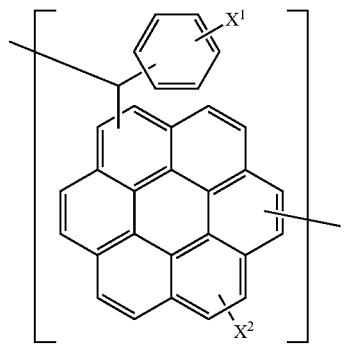

wherein, in the above Chemical Formulae 2-1a, 2-1b, 2-2a, 2-2b, 2-3a, and 2-3b, $X^1$ and $X^2$ may each independently be hydrogen, a hydroxy group, a cyano group, a thiol group, an amino group, a halogen, a halogen-containing group, or a combination thereof.

$M^2$ may be represented by one of the following Chemical Formula 3-1a, 3-1b, 3-2a, or 3-2b:

[Chemical Formula 3-1a]

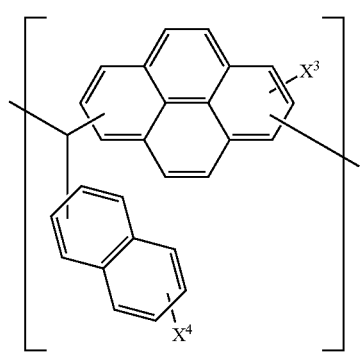

[Chemical Formula 3-1b]

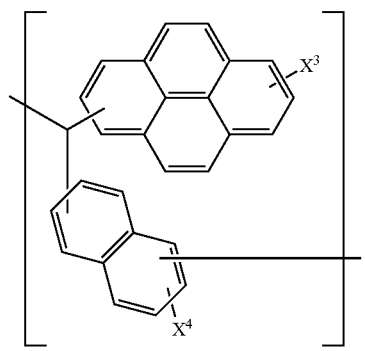

[Chemical Formula 3-2a]

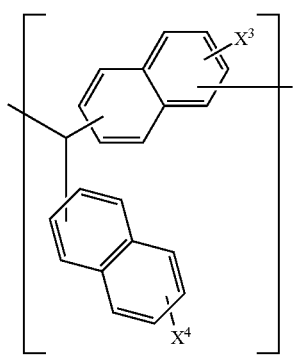

[Chemical Formula 3-2b]

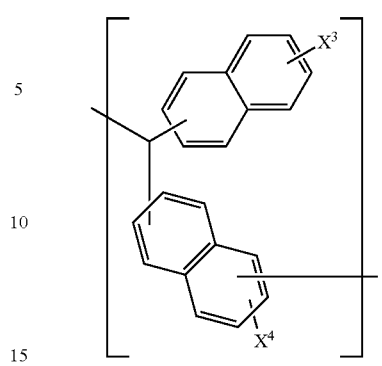

wherein, in the above Chemical Formulae 3-1a, 3-1b, 3-2a, and 3-2b, $X^3$ and $X^4$ may each independently be hydrogen, a hydroxy group, a cyano group, a thiol group, an amino group, a halogen, a halogen-containing group, or a combination thereof.

The polymer may include a moiety represented by one of the following Chemical Formula 1-1, 1-2, 1-3, or 1-4:

[Chemical Formula 1-1]

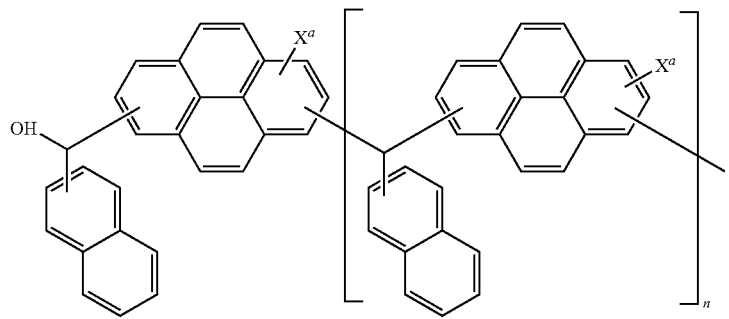

[Chemical Formula 1-2]

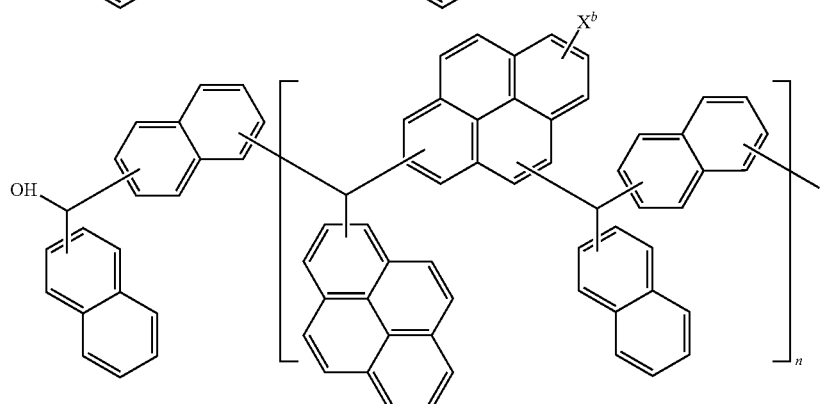

[Chemical Formula 1-3]

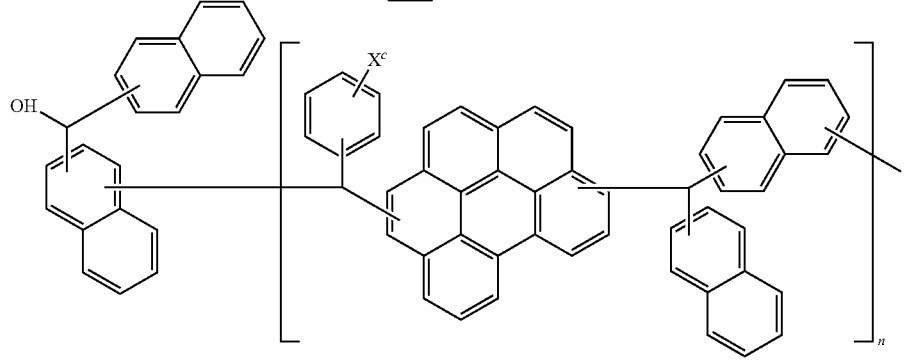

-continued

[Chemical Formula 1-4]

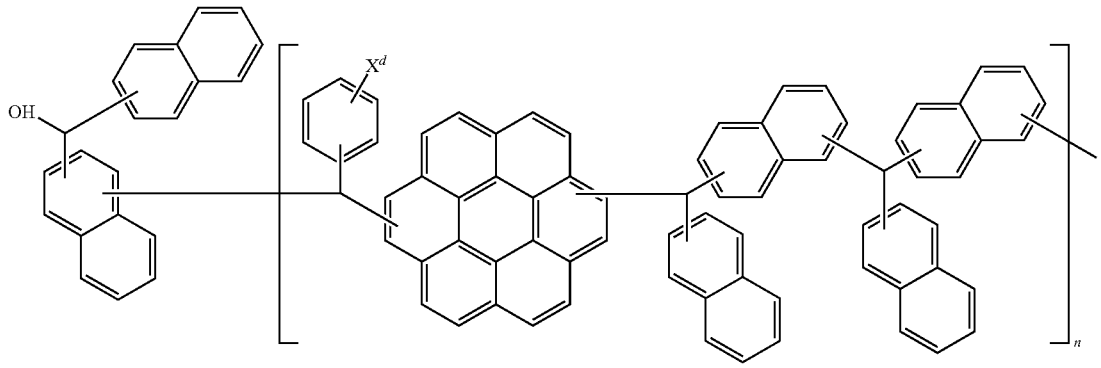

wherein, in the above Chemical Formulae 1-1, 1-2, 1-3, and 1-4, $X^a$, $X^b$, $X^c$, and $X^d$ may each independently be a hydroxy group, a cyano group, a thiol group, an amino group, a halogen, a halogen-containing group, or a combination thereof, and n may be an integer of 1 to 10.

The polymer may have a weight average molecular weight of about 1,000 to about 100,000.

The polymer may be included in the composition an amount of about 0.1 to about 30 parts by weight, based on 100 parts by weight of the solvent.

The embodiments may be realized by providing a method of forming patterns, the method including providing a material layer on a substrate, applying the hardmask composition according to an embodiment on the material layer to form a hardmask layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

Applying the hardmask composition may include performing a spin-on coating.

Heat-treating the hardmask composition to form a hardmask layer may include heat-treating at about 100° C. to about 500° C.

The method may further include forming a bottom antireflective coating on the silicon-containing thin layer prior to forming the photoresist layer.

The silicon-containing thin layer may include silicon oxynitride, silicon oxide, silicon nitride, or a combination thereof.

BRIEF DESCRIPTION OF THE DRAWING

Features will be apparent to those of skill in the art by describing in detail exemplary embodiments with reference to the attached drawing in which:

FIG. 1 illustrates a Calculation Equation for evaluating planarization characteristics.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, when a definition is not otherwise provided, the term 'substituted' may refer to one substituted with a substituent selected from a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of a hydrogen atom of a compound.

As used herein, when a definition is not otherwise provided, the term 'hetero' refers to one including 1 to 3 heteroatoms selected from B, N, O, S, and P.

Hereinafter, a hardmask composition according to one embodiment is described.

A hardmask composition according to one embodiment may include a solvent and a polymer including a moiety represented by the following Chemical Formula 1.

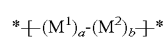  [Chemical Formula 1]

In the above Chemical Formula 1, $M^1$ and $M^2$ may each independently be, e.g., repeating units including an aliphatic cyclic group or an aromatic ring group, a may be 0 or 1, and b may be an integer of 1 to 3.

In an implementation, $M^1$ may be represented by one of the following Chemical Formula 2a or 2b, and $M^2$ may be represented by one of the following Chemical Formula 3a or 3b.

[Chemical Formula 2a]

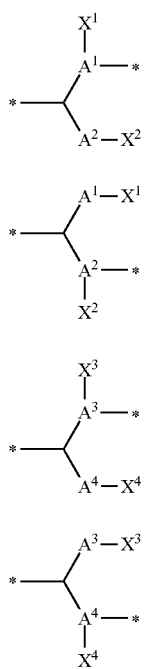

[Chemical Formula 2b]

[Chemical Formula 3a]

[Chemical Formula 3b]

In the above Chemical Formulae 2a, 2b, 3a and 3b, $A^1$ to $A^4$ may each independently be or include, e.g., an aliphatic cyclic group or an aromatic ring group, $X^1$ to $X^4$ may each independently be or include, e.g., hydrogen, a hydroxy group, a cyano group, a thiol group, an amino group, a halogen, a halogen-containing group, or a combination thereof.

In the above Chemical Formulae 1, 2a, 2b, 3a and 3b, "*" denotes a bonding position or site with another moiety or neighboring atom.

In an implementation, $A^1$ to $A^4$ may each independently be or include, e.g., a substituted or unsubstituted group, e.g., cyclic group, selected from the following Group 1.

[Group 1]

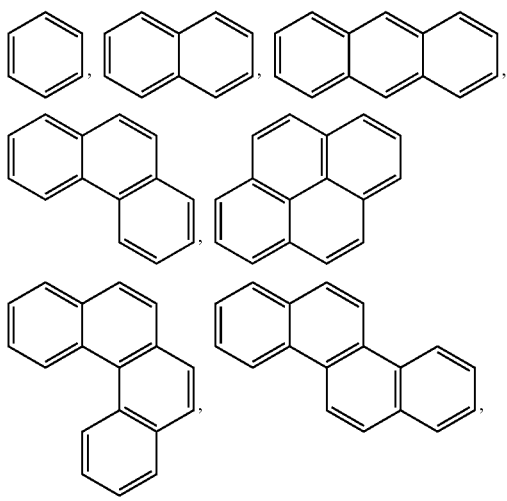

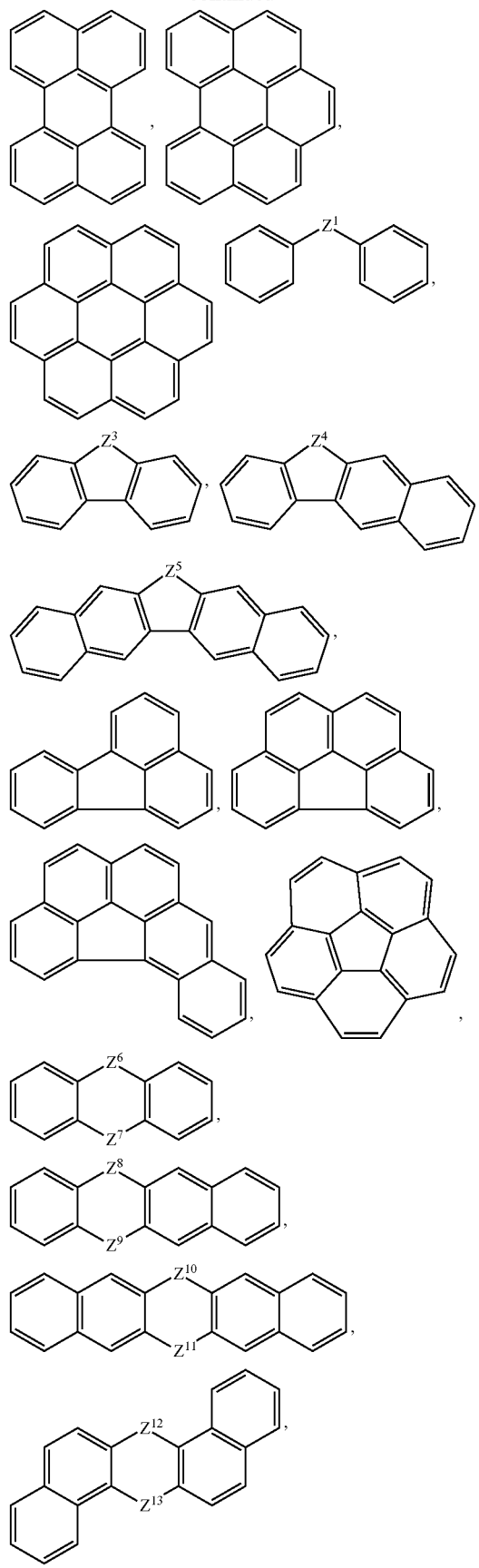

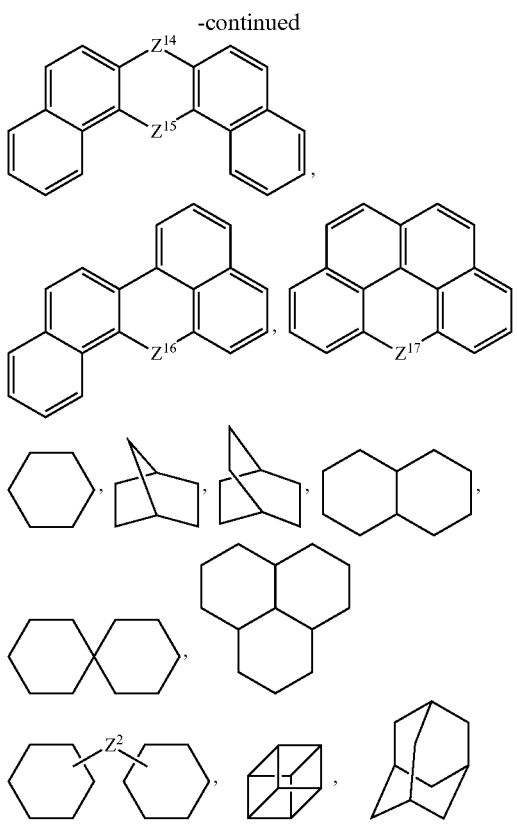

In Group 1, $Z^1$ and $Z^2$ may each independently be or include, e.g., a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, $NR^a$, oxygen (O), sulfur (S), or a combination thereof. In an implementation, $R^a$ may be hydrogen, a substituted or unsubstituted C1 to C10 alkyl group, a halogen, or a combination thereof.

$Z^3$ to $Z^{17}$ may each independently be or include, e.g., C=O, $NR^d$, oxygen (O), sulfur (S), $CR^bR^c$, or a combination thereof. In an implementation, $R^b$ to $R^d$ may each independently be hydrogen, a substituted or unsubstituted C1 to C10 alkyl group, a halogen, a halogen-containing group, or a combination thereof.

In the above Chemical Formula 1, when a is 0, only the repeating unit (a second repeating unit) or moiety represented by $M^2$ may be present in the moiety represented by Chemical Formula 1. In an implementation, the second repeating unit, e.g. $M^2$ may include all the same groups or structures, or may include different structures (but still represented by Chemical Formula 3a or 3b).

In Chemical Formula 1, when a is 1, the repeating unit (a first repeating unit) or moiety represented by $M^1$ and the repeating unit (a second repeating unit) or moiety represented by $M^2$ may both be present in the moiety represented by Chemical Formula 1. Herein, a mole number or ratio of the second repeating unit or moiety relative to the first repeating unit or moiety may be 1 to 3. In an implementation, the first repeating unit (e.g. $M^1$) may have a larger molecular weight than the second repeating unit (e.g. $M^2$). For example, the first repeating unit (e.g. $M^1$) may a molecular weight of about 500 to about 5,000, and the second repeating unit (e.g. $M^2$) may have a molecular weight of about 250 to about 3,000.

In an implementation, the first repeating unit and the second repeating unit may each independently include at least one polycyclic aromatic group.

In an implementation, $M^1$ may be represented by one of the following Chemical Formula 2-1a, 2-1b, 2-2a, 2-2b, 2-3a, or 2-3b.

[Chemical Formula 2-1a]

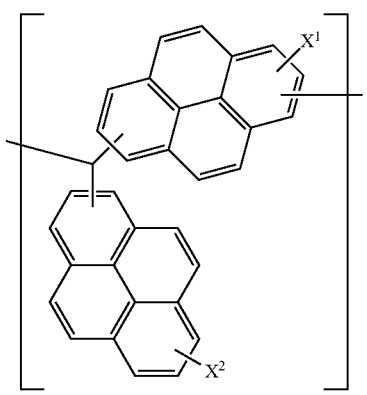

[Chemical Formula 2-1b]

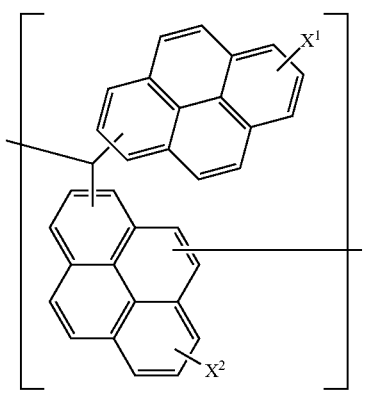

[Chemical Formula 2-2a]

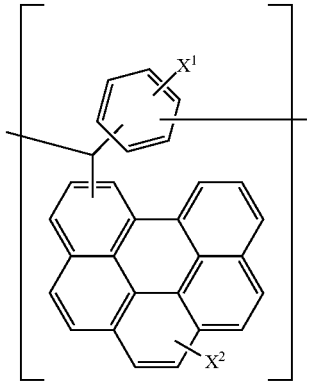

[Chemical Formula 2-2b]

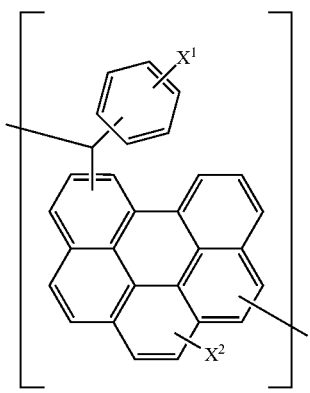

[Chemical Formula 2-3a]

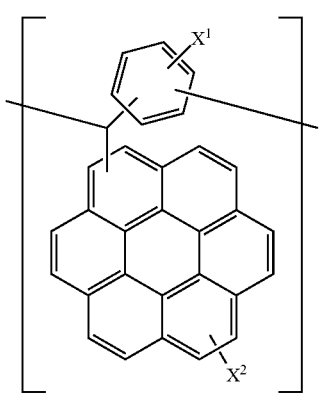

[Chemical Formula 2-3b]

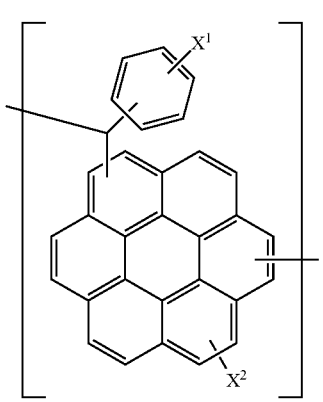

[Chemical Formula 3-1a]

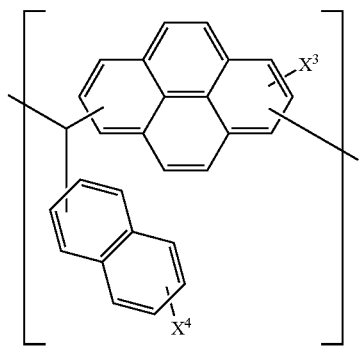

[Chemical Formula 3-1b]

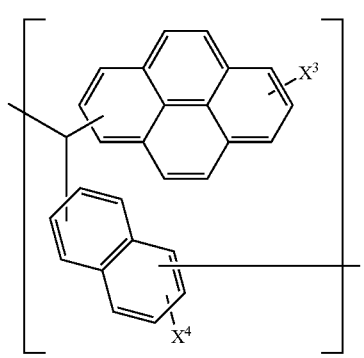

[Chemical Formula 3-2a]

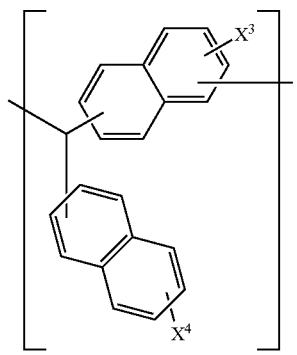

[Chemical Formula 3-2b]

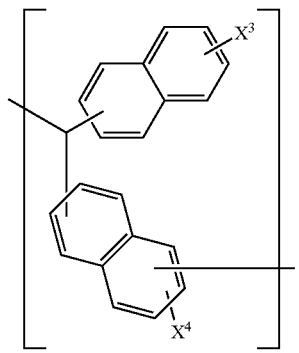

In the above Chemical Formulae 2-1a, 2-1b, 2-2a, 2-2b, 2-3a, and 2-3b, $X^1$ and $X^2$ may each independently be or include, e.g., hydrogen, a hydroxy group, a cyano group, a thiol group, an amino group, a halogen, a halogen-containing group, or a combination thereof.

In an implementation, $M^2$ may be represented by one of the following Chemical Formula 3-1a, 3-1b, 3-2a, or 3-2b.

In the above Chemical Formulae 3-1a, 3-1b, 3-2a, and 3-2b, $X^3$ and $X^4$ may each independently be or include, e.g., hydrogen, a hydroxy group, a cyano group, a thiol group, an amino group, a halogen, a halogen-containing group, or a combination thereof.

When a hardmask composition is prepared by using a monomer, a particular functional group (functioning as a cross-linking site in the monomer) may be provided. When a hardmask composition is prepared by using a polymer (obtained by polymerizing the monomer according to an embodiment), the particular functional group capable of providing polarity and etching performance of the polymer may be relatively freely introduced thereinto, and the cross-linking site may not be provided inside or on each monomer. In an implementation, the polymer of the hardmask composition according to an embodiment may include a moiety that includes at least one polycyclic aromatic group as described above and thus, may help secure rigid characteristics.

In an implementation, the polymer may include a moiety represented by the following Chemical Formula 4.

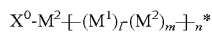  [Chemical Formula 4]

In the above Chemical Formula 4, $M^1$ and $M^2$ may each independently include an aliphatic cyclic group or an aromatic ring group, $X^0$ may be or include, e.g., a hydroxy group, a cyano group, a thiol group, an amino group, a halogen, a halogen-containing group, or a combination thereof, l may be 0 or 1, m may be an integer of 1 to 3, and n may be an integer of 1 to 10.

In the above Chemical Formula 4, $M^1$ may be represented by the above Chemical Formula 2a or 2b, and $M^2$ may be represented by the above Chemical Formula 3a or 3b. For example, Chemical Formulae 2a, 2b, 3a, and 3b may be the same as described above with respect to Chemical Formula 1.

In an implementation, the polymer may include a moiety represented by one of the following Chemical Formula 1-1, 1-2, 1-3, or 1-4.

[Chemical Formula 1-1]

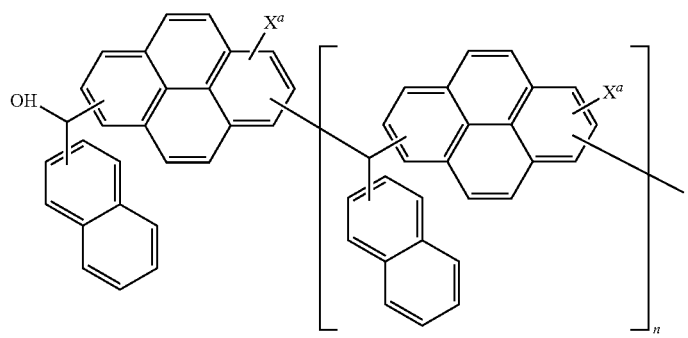

[Chemical Formula 1-2]

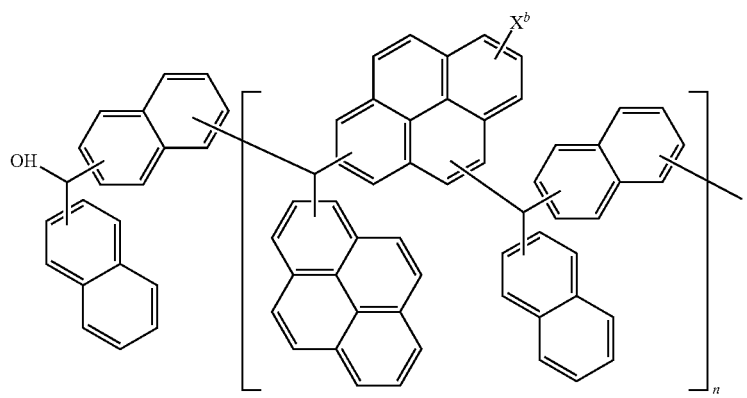

[Chemical Formula 1-3]

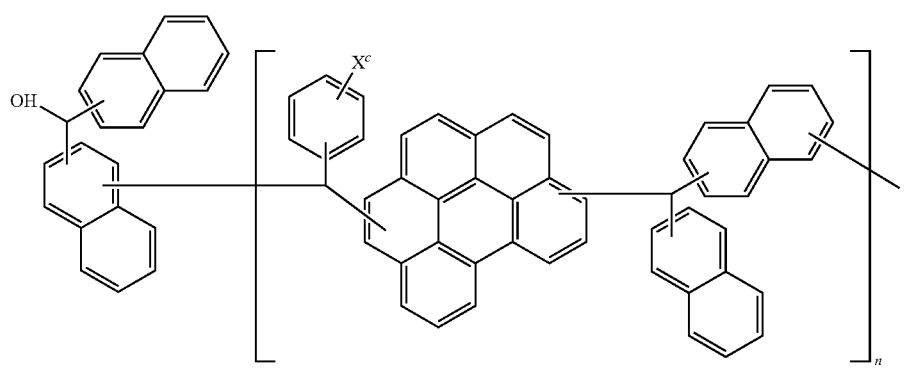

[Chemical Formula 1-4]

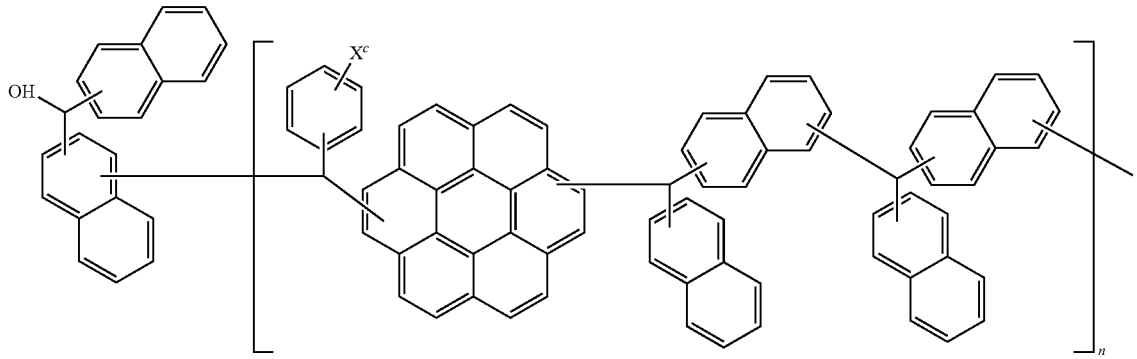

In the above Chemical Formulae 1-1, 1-2, 1-3 and 1-4, $X^a$, $X^b$, $X^c$, and $X^d$ may each independently be or include, e.g., a hydroxy group, a cyano group, a thiol group, an amino group, a halogen, a halogen-containing group, or a combination thereof, and n may be an integer of 1 to 10, e.g., 1 to 5.

In an implementation, the polymer may have a weight average molecular weight of about 1,000 to about 100,000. When the polymer has a weight average molecular weight within the range, the hardmask composition including the polymer may be optimized by adjusting its carbon content and solubility in a solvent.

The solvent in the hardmask composition may be a suitable solvent that sufficiently dissolves or disperses the monomer and/or the polymer. In an implementation, the solvent may include, e.g., propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, or ethyl 3-ethoxypropionate.

The polymer may be included in the composition in an amount of about 0.1 to about 30 parts by weight, based on a total weight of the hardmask composition. In an implementation, the polymer may be included in the composition in an amount of about 0.1 to about 30 parts by weight, based on 100 parts by weight of the solvent. When the polymer is included within the range, a thickness, surface roughness, and planarization degrees of a hardmask layer may be controlled.

In an implementation, the hardmask composition may further include a surfactant.

The surfactant may include, e.g., an alkylbenzene sulfonate salt, an alkyl pyridinium salt, polyethylene glycol, or a quaternary ammonium salt.

The surfactant may be included in the composition in an amount of about 0.001 to about 3 parts by weight, based on 100 parts by weight of the hardmask composition. Within this amount, the solubility may be secured while not changing the optical properties of the hardmask composition.

Hereafter, a method for forming patterns by using the hardmask composition is described.

A method of forming patterns according to an embodiment may include providing a material layer on a substrate, applying the hardmask composition (including the polymer and the solvent) on the material layer, heat-treating the hardmask composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer and etching an exposed part of the material layer.

The substrate may be, e.g., a silicon wafer, a glass substrate, or a polymer substrate.

The material layer may be a material to be finally patterned, e.g., a metal layer such as an aluminum layer or a copper layer, a semiconductor layer such as a silicon layer, or an insulation layer such as a silicon oxide or a silicon nitride. The material layer may be formed through a method, e.g., a chemical vapor deposition (CVD) process.

The hardmask composition may be applied by spin-on coating in a form of a solution. In an implementation, a thickness of the hardmask composition may be, e.g., about 50 Å to about 10,000 Å.

The heat-treating the hardmask composition may be performed, e.g., at about 100 to about 500° C. for about 10 seconds to 1 hour.

The silicon-containing thin layer may be made of, e.g., silicon nitride, silicon oxide, silicon oxynitride, or a combination thereof.

The method may further include forming a bottom antireflective coating (BARC) on the silicon-containing thin layer before forming the photoresist layer.

Exposure of the photoresist layer may be performed using, e.g., ArF, KrF, or EUV. After exposure, heat treatment may be performed at about 100° C. to about 500° C.

The etching process of the exposed part of the material layer may be performed through a dry etching process using an etching gas and the etching gas may be, e.g., $CHF_3$, $CF_4$, $Cl_2$, $BCl_3$, or a mixed gas thereof.

The etched material layer may be formed in a plurality of patterns, and the plurality of patterns may include a metal pattern, a semiconductor pattern, an insulation pattern, or the like, e.g., diverse patterns of a semiconductor integrated circuit device.

Hereinafter, the present disclosure is illustrated in more detail with reference to examples. However, these examples are exemplary, and the present disclosure is not limited thereto.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLES

Synthesis Example 1

First Step: Friedel-Crafts Acylation Reaction

Methoxy pyrene (23.20 g, 0.1 mol), 2-naphthoyl chloride (56.8 g, 0.333 mol), and 1,2-dichloroethane (325 g) were put in a flask. Then, aluminum chloride (29.4 g, 0.12 mol) was slowly added to the solution at ambient temperature, and the mixture was agitated for 2 hours. When the reaction was terminated, a precipitate obtained by adding methanol thereto was filtered, obtaining 2-naphthoyl methoxy pyrene.

Second Step: Demethylation Reaction

The synthesized 2-naphthoyl methoxy pyrene (30.9 g, 0.08 mol), 1-dodecanethiol (48.58 g, 0.24 mol), potassium hydroxide (16.8 g, 0.3 mol), and N,N-dimethylformamide (350 g) were put in a flask and then agitated at 100° C. for 2 hours. The reaction mixture was cooled down to ambient temperature and agitated and then neutralized to about pH 7 by adding a 10% hydrogen chloride (hydrochloric acid) solution thereto. Then, the resultant was extracted by using ethyl acetate, obtaining 2-naphthoyl hydroxy pyrene.

Third Step: Reduction Reaction 2-naphthoyl hydroxy pyrene (26.07 g, 0.07 mol), tetrahydrofuran (78 g), and MeOH (78 g) were put in a flask and then agitated at ambient temperature. Then, sodium borohydride (13.2 g, 0.35 mol) was little by little slowly added to the solution, and one hour later, the mixture was heated up to 50° C. and reacted for 12 hours. When the reaction was terminated, the resultant was neutralized by using a 10% hydrogen chloride solution and then, extracted by using ethyl acetate, obtaining (hydroxy-(2-naphthalenyl)methyl)-6-pyrenol represented by Chemical Formula a.

[Chemical Formula a]

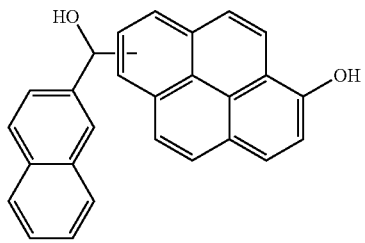

Synthesis Example 2

Dinaphthalen-2-yl methanol represented by the following Chemical Formula b was synthesized by using naphthalene (25.63 g, 0.2 mol) and 2-naphthoyl chloride (56.8 g, 0.333 mol) according to the same method as the Friedel-Crafts Acylation reaction and reduction reaction of Synthesis Example 1.

[Chemical Formula b]

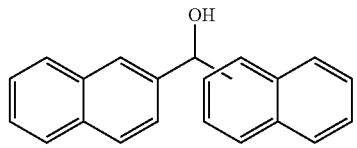

Synthesis Example 3

(Hydroxy(pyren-2-yl)methyl)-6-pyrenol represented by the following Chemical Formula c was synthesized by using hydroxypyrene (21.8 g, 0.1 mol) and pyrene-1-carbonyl chloride (26.4 g, 0.1 mol) according to the same method as the Friedel-Crafts Acylation reaction and reduction reaction of Synthesis Example 1.

[Chemical Formula c]

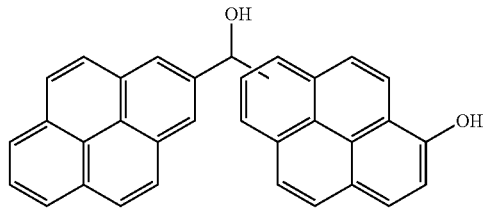

Synthesis Example 4

4-benzoperylenyl(hydroxy)methyl)phenol represented by the following Chemical Formula d was synthesized by using benzoperylene (27.6 g, 0.1 mol) and 4-methoxy benzoyl chloride (17.1 g, 0.1 mol) according to the same method as the Friedel-Crafts Acylation reaction and reduction reaction of Synthesis Example 1.

[Chemical Formula d]

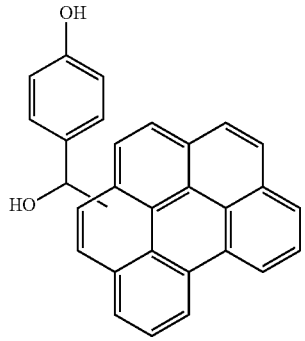

Synthesis Example 5

31.6 g (0.1 mol) of coronene and 26.7 g (0.1 mol) of 4-iodinebenzoyl chloride along with 450 g of a mixed solvent of chloroform/dichloromethane were put in a flask and agitated, 24.5 g (0.1 mol) of aluminum chloride was little by little added thereto, and the mixture was reacted at 40° C. and agitated for 12 hours. When the reaction was terminated, a precipitate obtained by adding methanol thereto was filtered and washed with methanol.

The dried product (42.6 g, 0.08 mol), $K_4Fe(CN)_6$ (0.06 mol), a PS—Pd (II) anthra catalyst (1.0 mol % of Pd) and triethylamine (0.2 mol) were dissolved in 300 mL of N,N-dimethyl formamide, and the solution was reacted at 100° C. for 24 hours. When the reaction was terminated, the reaction mixture was cooled down to ambient temperature and then, filtered to remove the PS—Pd (II)-anthra catalyst, and the filtered solution was refined by using silica gel. The obtained powder was dissolved in 300 mL of tetrahydrofuran, and 38 g (1.0 mol) of lithium aluminum hydride ($LiAlH_4$) was little by little added thereto for a reaction. When the reaction was terminated, a mixture of water/ethyl acetate was used to remove a by-product from the reaction, obtaining a compound represented by the following Chemical Formula e.

[Chemical Formula e]

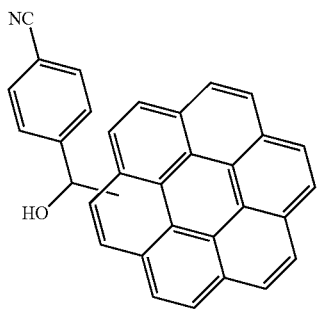

Polymerization Example 1

The hydroxy (2-naphthalenyl)methyl pyrenol (26.2 g, 0.07 mol) according to Synthesis Example 1 along with p-toluene sulfonic acid monohydrate (0.027 g, 0.14 mmol) and propylene glycol monomethyl ether acetate (PGMEA) (60.8 g) was put in a flask and polymerized at 100° C. The reaction was terminated when a specimen taken every one hour turned out to have a weight average molecular weight ranging from 2,000 to 2,700 through gel permeation chromatography (GPC). Herein, the weight average molecular weight was measured by taking 0.02 g of the polymerization reactant, diluting it in tetrahydrofuran (THF) until a solid content became 4 wt %, and then, filtering it.

When the polymerization reaction was terminated, the reactant was cooled down to ambient temperature and added to 60 g of distilled water and 60 g of methanol, and the mixture was strongly agitated and allowed to stand. After removing a supernatant therefrom, a precipitate remaining there was dissolved in 60 g of propylene monomethyl ether acetate (PGMEA), and methanol and distilled water remaining in the solution were removed under a reduced pressure, obtaining a compound represented by the following Chemical Formula A (a weight average molecular weight of 2,300, $4 \leq n \leq 7$).

[Chemical Formula A]

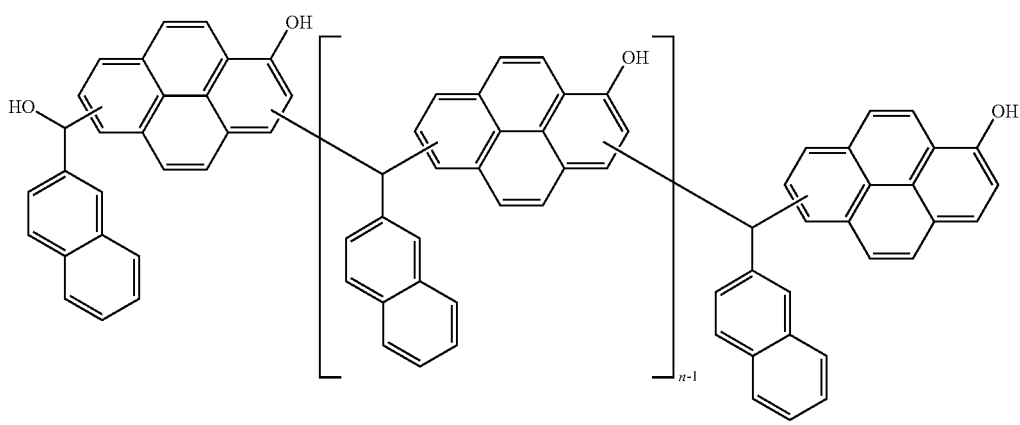

Polymerization Example 2

The dinaphthalen-2-yl methanol (14.2 g, 0.05 mol) according to Synthesis Example 2 and the hydroxy pyren-2-yl methyl pyrenol (13.4 g, 0.03 mol) according to Synthesis Example 3 were polymerized according to the same method as Polymerization Example 1. The polymerization was terminated when the product had a molecular weight ranging from 2,000 to 3,000, obtaining a compound represented by the following Chemical Formula B (a weight average molecular weight of 3,100, $3 \leq n \leq 4$).

[Chemical Formula B]

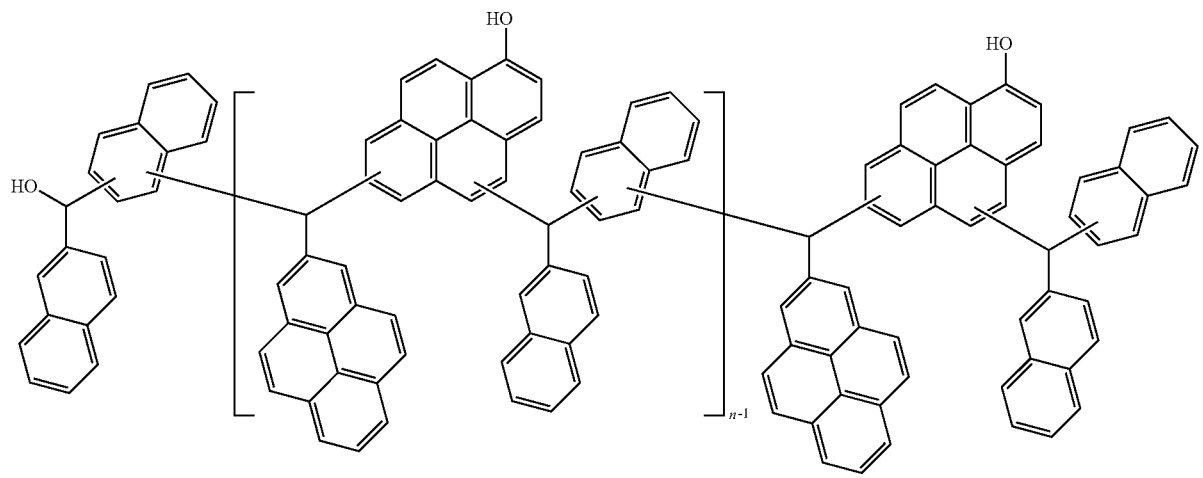

Polymerization Example 3

The dinaphthalen-2-yl methanol (14.2 g, 0.05 mol) according to Synthesis Example 2 and the benzoperylenyl(hydroxy) methyl phenol (19.9 g, 0.05 mol) according to Synthesis Example 4 were polymerized according to the same method as Polymerization Example 1. The polymerization was terminated when the product had a molecular weight ranging from 2,000 to 4,000, obtaining a compound represented by the following Chemical Formula C (a weight average molecular weight of 2,900, $3 \leq n \leq 5$).

[Chemical Formula C]

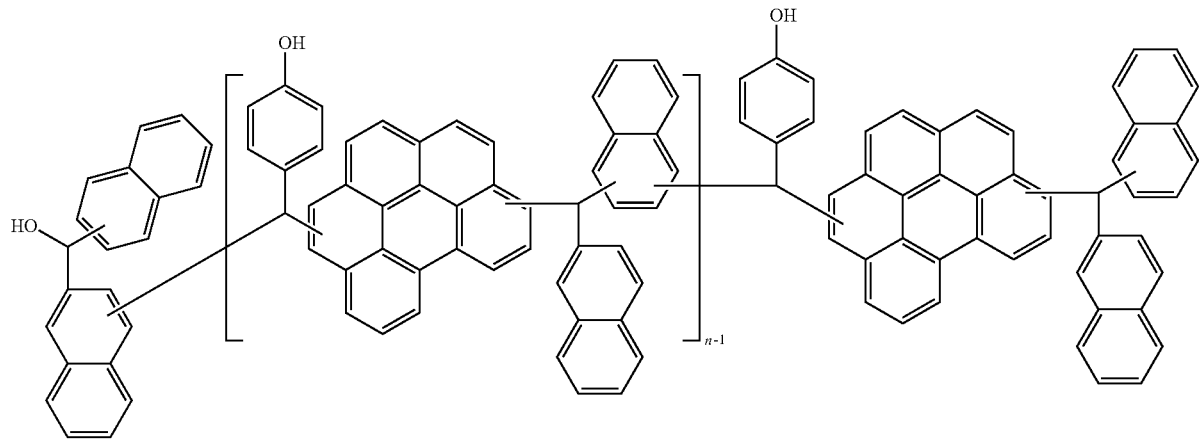

Polymerization Example 4

The dinaphthalen-2-yl methanol (28.4 g, 0.1 mol) according to Synthesis Example 2 and the coronenyl (hydroxy) methyl benzonitrile (21.57 g, 0.05 mol) according to Synthesis Example 5 were polymerized according to the same method as Polymerization Example 1. The polymerization was terminated when the product had a molecular weight ranging from 2,000 to 4,000, obtaining a compound represented by the following Chemical Formula D (a weight average molecular weight of 3,500, 3≤n≤4).

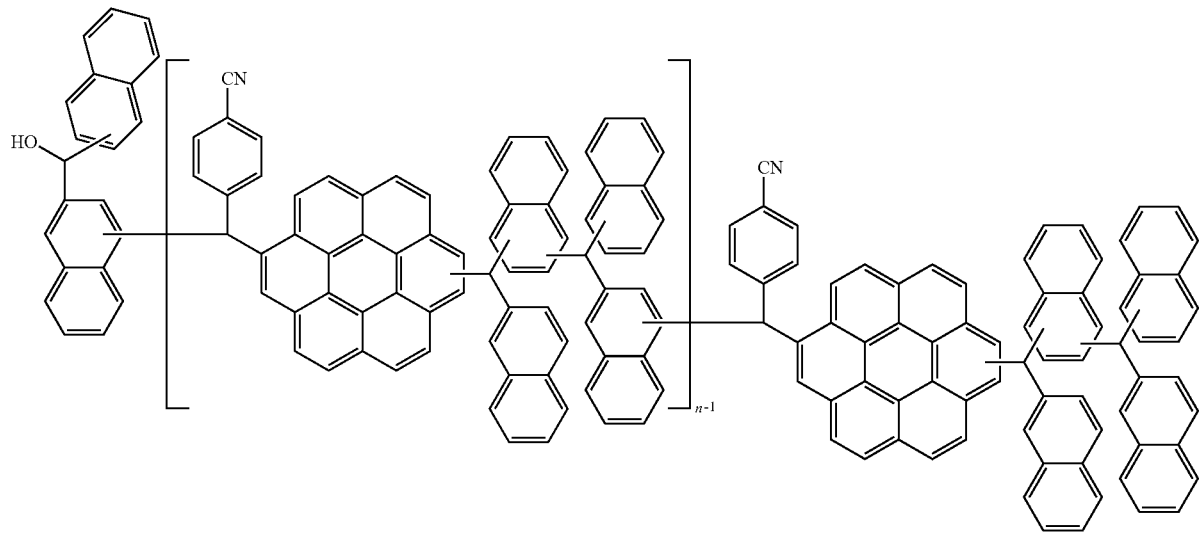

[Chemical Formula D]

Comparative Polymerization Example 1

28.83 g (0.2 mol) of 1-naphthol, 30.5 g (0.14 mol) of hydroxypyrene, and 12.0 g (0.34 mol) of paraformaldehyde were put in a flask and dissolved in 0.19 g (1 mmol) of p-toluene sulfonic acid monohydrate and 162 g of propylene glycol monomethyl ether acetate (PGMEA), and the solution was agitated at 70° C. for 5 to 12 hours to perform a polymerization reaction. The polymerization reaction was terminated according to the same method as Polymerization Example 1 when the product had a weight average molecular weight ranging from 1,800 to 2,500. When the polymerization reaction was terminated, the reactant was slowly cooled down to ambient temperature and added to 40 g of distilled water and 400 g of methanol, and the mixture was strongly agitated and then, allowed to stand. After removing a supernatant therefrom, the obtained precipitate was dissolved in 80 g of propylene glycol monomethyl ether acetate (PGMEA), and the solution was strongly agitated by using 320 g of methanol and allowed to stand (primary). Herein, after removing a supernatant produced therein, the obtained precipitate was dissolved in 80 g of propylene glycol monomethyl ether acetate (PGMEA) (secondary). The primary and secondary processes were regarded as one refinement process, and the refinement process was performed three times in total. The refined polymer was dissolved in 80 g of propylene glycol monomethyl ether acetate (PGMEA), and the methanol and distilled water remaining in the solution were removed under a reduced pressure, obtaining a compound having a repeating unit represented by the following Chemical Formula E (a weight average molecular weight of 3,200, polydispersity of 1.45).

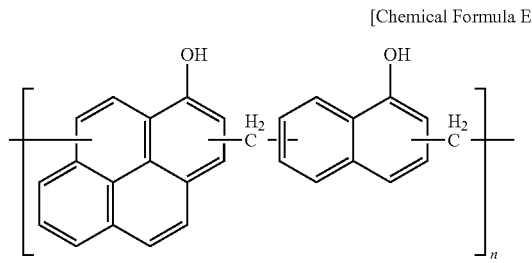

[Chemical Formula E]

Preparation of Hardmask Composition

Example 1

The compound according to Polymerization Example 1 was dissolved in a mixed solvent of propylene glycol monomethylether acetate (PGMEA) and cyclohexanone (7:3 (v/v)), preparing a hardmask composition. The wt % of the compound was adjusted based on the total weight of the hardmask composition depending on a desired thickness.

Example 2

A hardmask composition was prepared according to the same method as Example 1 except for using the compound according to Polymerization Example 2 instead of the compound according to Polymerization Example 1.

Example 3

A hardmask composition was prepared according to the same method as Example 1 except for using the compound according to Polymerization Example 3 instead of the compound according to Polymerization Example 1.

Example 4

A hardmask composition was prepared according to the same method as Example 1 except for using the compound according to Polymerization Example 4 instead of the compound according to Polymerization Example 1.

Comparative Example 1

A hardmask composition was prepared according to the same method as Example 1 except for using the compound according to Comparative Polymerization Example 1 instead of the compound according to Polymerization Example 1.

Evaluation

Evaluation 1: Chemical Resistance

Each hardmask composition according to Examples 1 to 4 and Comparative Example 1 was respectively spin-on coated to be 2,000 Å thick on a bare silicon wafer. The coated silicon wafer was heat treated in 10° C. increments within a range of 150° C. to 300° C. for 1 minute and dipped in a KrF thinner for 1 minute, and then, the thickness of a thin film formed thereon was measured. Then, thickness change of each thin film before and after the dipping was measured to obtain a temperature that the hardmask compositions according to Examples 1 to 4 and Comparative Example 1 were cross-linked and ensured chemical resistance of each hardmask layer.

The results are provided in Table 1.

TABLE 1

| | Temperature for forming hardmask (temperature for ensuring chemical resistance) |
|---|---|
| Example 1 | 190° C. |
| Example 2 | 190° C. |
| Example 3 | 150° C. |
| Example 4 | 170° C. |
| Comparative Example 1 | 260° C. |

Referring to Table 1, the hardmask compositions according to Examples 1 to 4 exhibited chemical resistance at a low temperature (less than or equal to 200° C.) and may be used to form a lower or under layer in a pattern process requiring a relatively low process temperature ranging from 200° C. to 250° C. or less.

Evaluation 2: Thickness Decrease Ratio

Each hardmask composition according to Examples 1 to 4 and Comparative Example 1 was respectively spin-on coated on a bare silicon wafer to have a thickness of about 3,000 Å to 3,500 Å after pre-baking. Then, a thin film thickness decrease rate was obtained by measuring thickness of the thin film after heat-treating the coated silicon wafer at 400° C. for 2 minutes.

The results are provided in the following Table 2.

TABLE 2

| | Thickness (Å) | | | Thickness decrease ratio (%) |
|---|---|---|---|---|
| | After pre-baking (240° C.) | After baking (400° C.) | Thickness changes | |
| Example 1 | 3226 | 3015 | 251 | 7.68 |
| Example 2 | 3303 | 3002 | 301 | 9.1 |
| Example 3 | 3188 | 3009 | 179 | 5.6 |
| Example 4 | 3293 | 3112 | 181 | 5.5 |
| Comparative Example 1 | 3409 | 3020 | 389 | 11.40 |

Referring to Table 2, the hardmask compositions according to Examples 1 to 4 showed an improved thin film thickness decrease ratio (less than or equal to 10%) after the heat treatment, compared with that of Comparative Example 1.

Accordingly, when the hardmask compositions according to Examples 1 to 4 were respectively coated on a patterned wafer, a step difference between a cell region and a peripheral region having different film thicknesses was expected to be minimized.

Evaluation 3: Etch Resistance

Each hardmask composition according to Examples 1 to 4 and Comparative Example 1 was respectively spin-on coated to be about 4,000 Å thick on a silicon wafer. Then, a bulk etch test was performed by heat-treating the coated wafer at 350° C. for 2 minutes and then, dry-etching them with a mixed gas of $CHF_3/CF_4$ and $N_2/O_2$.

The results are provided in Table 3.

TABLE 3

| | Bulk etch rate (Å/sec) | |
|---|---|---|
| | mixed gas of $CHF_3/CF_4$ | mixed gas of $N_2/O_2$ |
| Example 1 | 27.5 | 24.5 |
| Example 2 | 28.4 | 25.5 |
| Example 3 | 28.2 | 24.4 |
| Example 4 | 27.5 | 23.8 |
| Comparative Example 1 | 30.1 | 27.8 |

Referring to Table 3, the hardmask compositions according to Examples 1 to 4 showed improved bulk etch characteristics, compared with the hardmask composition according to Comparative Example 1.

Evaluation 4: Gap-Fill and Planarization Characteristics

The hardmask composition Examples according to 1 to 4 and Comparative Example 1 were respectively spin-on coated on a patterned silicon wafer to be 2,200 Å thick on a bare wafer. Then, the coated wafer was baked at 350° C. for 2 minutes to form a thin film, and gap-fill and planarization characteristics of the thin film were examined by using a V-SEM equipment.

The gap-fill characteristics were evaluated by observing whether a void was produced on the cross-section of the patterns, and planarization characteristics of the film was digitized according to Calculation Equation shown in FIG. 1.

The planarization characteristics are better, as a coating thickness difference between a peripheral region and a cell region is smaller. For example, as the sum of (h0-h1), (h0-h2), (h0-h3), and (h0-h4) is smaller, a step difference is smaller, and the planarization characteristics are better.

The results are provided in Table 4.

TABLE 4

| | Planarization characteristics (Sum (Peripheral-Cell steps)) | Gap-fill characteristics (aspect ratio = 1:5) |
|---|---|---|
| Example 1 | 388.9 nm | No void |
| Example 2 | 402.0 nm | No void |
| Example 3 | 346.4 nm | No void |
| Example 4 | 412.7 nm | No void |
| Comparative Example 1 | 647.2 nm | No void |

Referring to Table 4, each hardmask layer formed by respectively using the compositions according to Examples 1 to 4 showed improved planarization characteristics, compared with that of Comparative Example 1. In addition, the hardmask layers formed of the compositions according to Examples 1 to 4 showed no void under a deep pattern condition (an aspect ratio of 1:5) and thus, excellent gap-fill characteristics.

By way of summation and review, according to small-sizing the pattern to be formed, some lithographic techniques may not provide a fine pattern having an excellent profile. Accordingly, a layer, called a hardmask layer, may be formed between the material layer and the photoresist layer to provide a fine pattern. The hardmask layer may play a role of an intermediate layer for transferring the fine pattern of photoresist to the material layer through the selective etching process. Accordingly, the hardmask layer may have characteristics such as heat resistance, etch resistance, and the like to be tolerated during the multiple etching processes. A hardmask layer may be formed by a spin-on coating method instead of the chemical vapor deposition. The spin-on coating method may be easy to perform and may also improve gap-fill characteristics and planarization characteristics. In the spin-on coating method, the composition should be soluble in a solvent. Some materials that provide the above characteristics of a hardmask layer may not be readily soluble, so a hardmask composition having good characteristics and solubility may be desirable.

The embodiments may provide a hardmask composition that provides a layer having good etch resistance, solubility in a solvent, gap-fill characteristics, and planarization characteristics.

For example, desirable characteristics (such as solubility in a solvent, gap-fill characteristics, and planarization characteristics) for a hardmask layer may be satisfied while also ensuring good etch resistance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:

a solvent; and a polymer including a moiety represented by the following Chemical Formula 4,

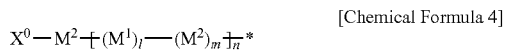

[Chemical Formula 4]

wherein, in the above Chemical Formula 4, $X^0$ is a hydroxy group, a cyano group, a thiol group, an amino group, a halogen, or a halogen-containing group, $X^0$-$M^2$- of chemical 4 is represented by one of the following Chemical Formula 3a' or 3b':

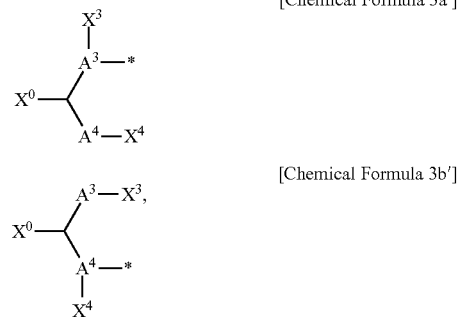

l is 1, m is an integer of 1 to 3, n is an integer of 1 to 10, $M^1$ is represented by one of the following Chemical Formula 2a or 2b, $M^2$ is represented by one of the following Chemical Formula 3a or 3b, and

* represents a binding site to a neighboring atom:

[Chemical Formula 2a]

[Chemical Formula 2b]

[Chemical Formula 3a]

-continued

[Chemical Formula 3b]

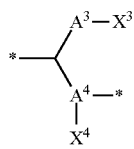

wherein, in the above Chemical Formulae 2a, 2b, 3a', 3b', 3a, and 3b,

A$^1$ to A$^4$ are each independently an aliphatic cyclic group or an aromatic ring group, X$^1$ to X$^4$ are each independently hydrogen, a hydroxy group, a cyano group, a thiol group, an amino group, a halogen, a halogen-containing group, or a combination thereof, and

* represents a binding site to a neighboring atom.

2. The hardmask composition as claimed in claim 1, wherein A$^1$ to A$^4$ are each independently a substituted or unsubstituted group selected from the following Group 1:

[Group 1]

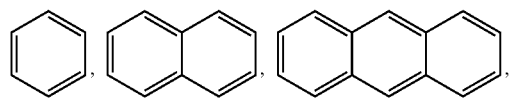

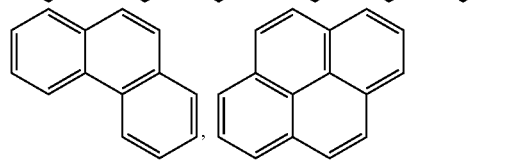

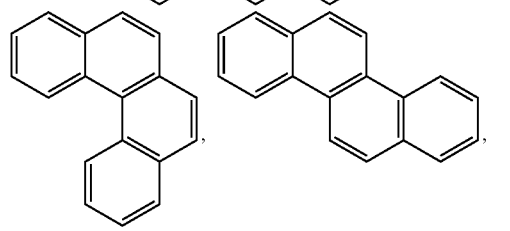

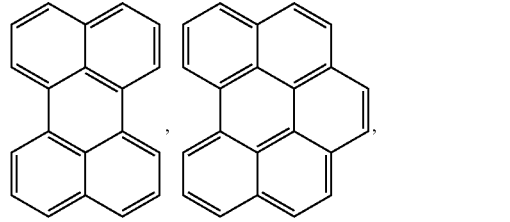

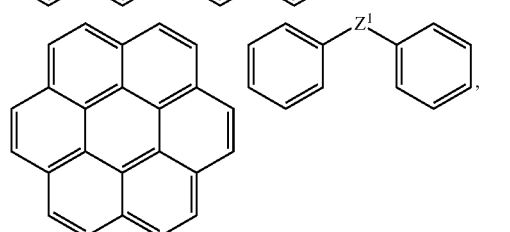

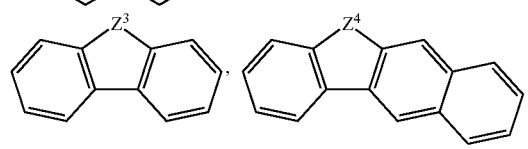

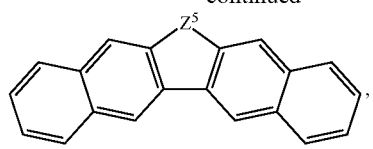

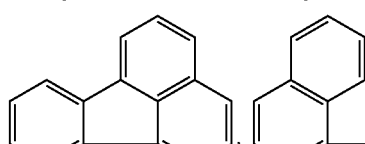

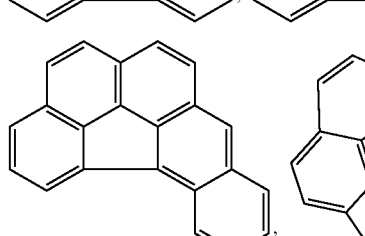

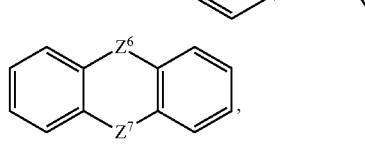

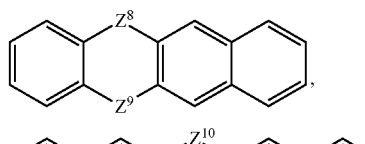

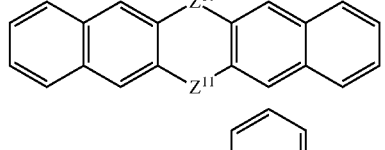

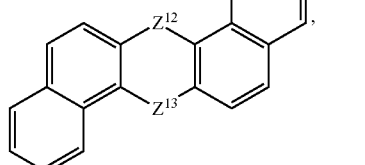

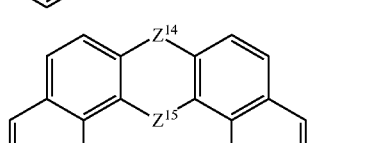

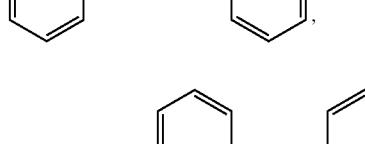

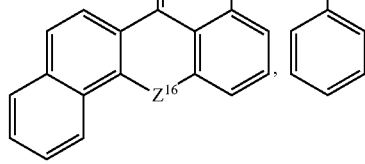

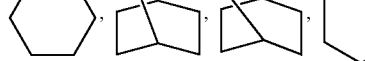

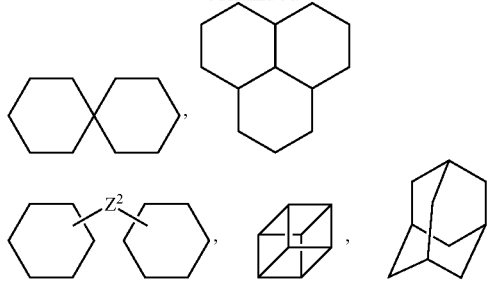

wherein, in Group 1,

Z¹ and Z² are each independently a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, C=O, NR$^a$, oxygen, sulfur, or a combination thereof, in which R$^a$ is hydrogen, a substituted or unsubstituted C1 to C10 alkyl group, a halogen, or a combination thereof, and Z³ to Z¹⁷ are each independently C=O, NR$^d$, oxygen, sulfur, CR$^b$R$^c$, or a combination thereof, in which R$^b$ to R$^d$ are each independently hydrogen, a substituted or unsubstituted C1 to C10 alkyl group, a halogen, a halogen-containing group, or a combination thereof.

3. The hardmask composition as claimed in claim 1, wherein:

M¹ and M² each independently include at least one polycyclic aromatic group.

4. The hardmask composition as claimed in claim 1, wherein:

M¹ has a larger molecular weight than M².

5. The hardmask composition as claimed in claim 1, wherein M¹ is represented by one of the following Chemical Formula 2-1a, 2-1b, 2-2a, 2-2b, 2-3a, or 2-3b:

[Chemical Formula 2-1a]

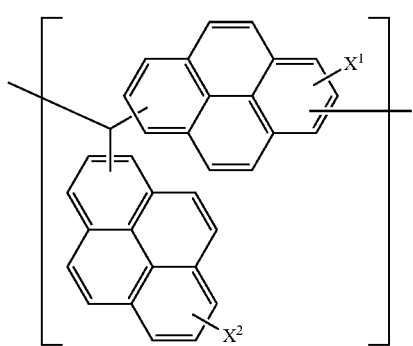

[Chemical Formula 2-1b]

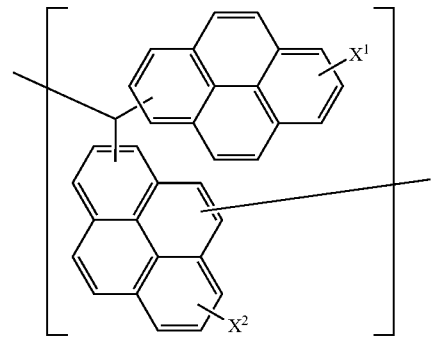

[Chemical Formula 2-2a]

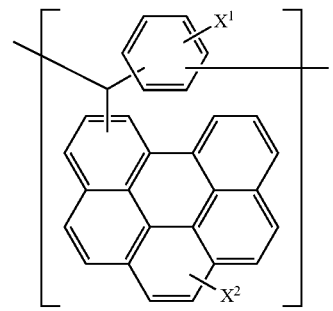

[Chemical Formula 2-2b]

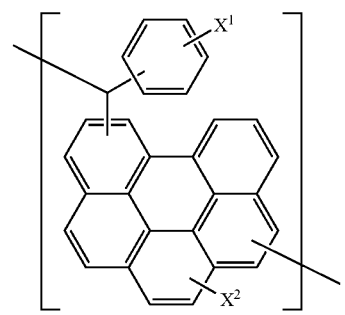

[Chemical Formula 2-3a]

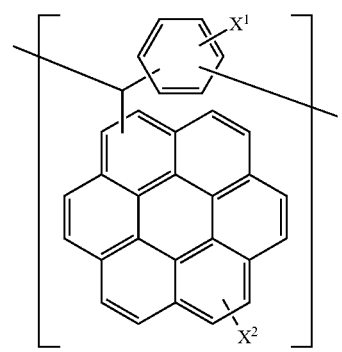

[Chemical Formula 2-3b]

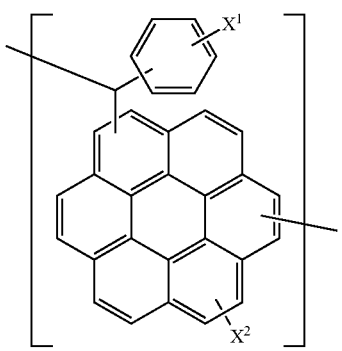

wherein, in the above Chemical Formulae 2-1a, 2-1b, 2-2a, 2-2b, 2-3a, and 2-3b, $X^1$ and $X^2$ are each independently hydrogen, a hydroxy group, a cyano group, a thiol group, an amino group, a halogen, a halogen-containing group, or a combination thereof.

6. The hardmask composition as claimed in claim 1, wherein $M^2$ is represented by one of the following Chemical Formula 3-1a, 3-1b, 3-2a, or 3-2b:

[Chemical Formula 3-1a]

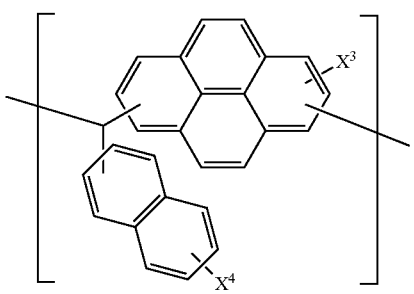

[Chemical Formula 3-1b]

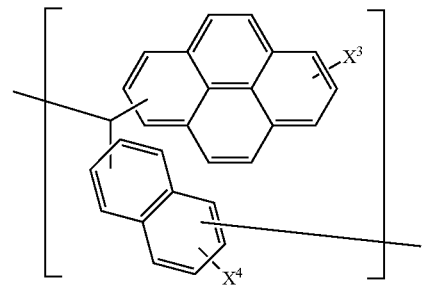

[Chemical Formula 3-2a]

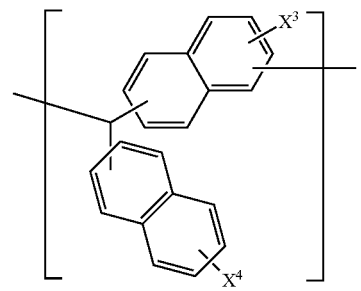

[Chemical Formula 3-2b]

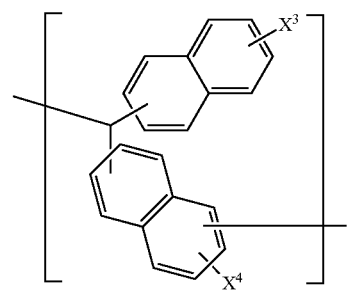

wherein, in the above Chemical Formulae 3-1a, 3-1b, 3-2a, and 3-2b, $X^3$ and $X^4$ are each independently hydrogen, a hydroxy group, a cyano group, a thiol group, an amino group, a halogen, a halogen-containing group, or a combination thereof.

7. The hardmask composition as claimed in claim 1, wherein the polymer includes a moiety represented by one of the following Chemical Formula 1-2, 1-3, or 1-4:

[Chemical Formula 1-2]

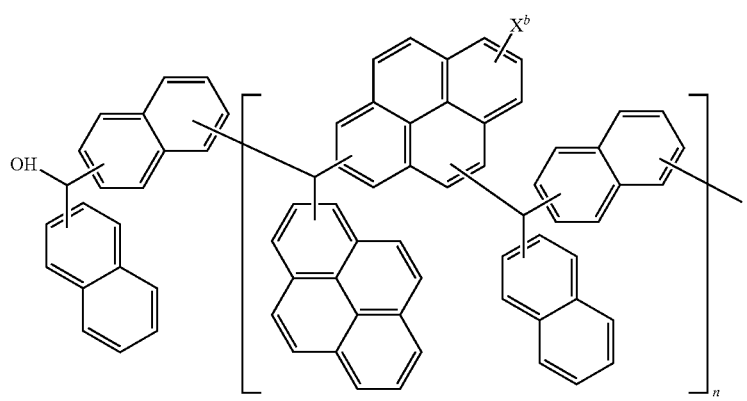

[Chemical Formula 1-3]

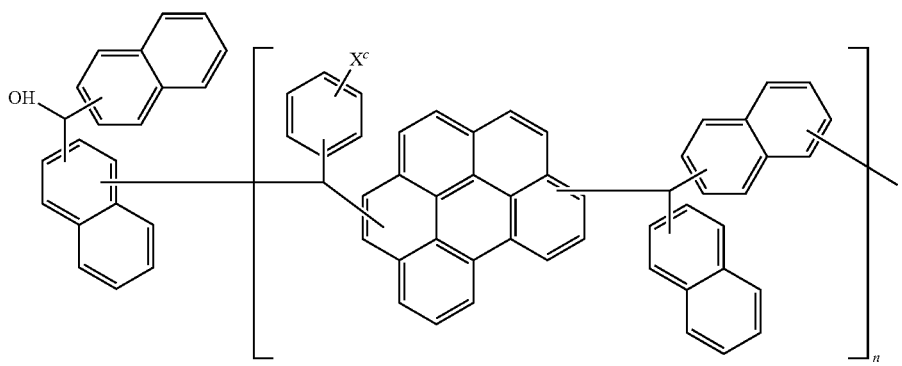

[Chemical Formula 1-4]

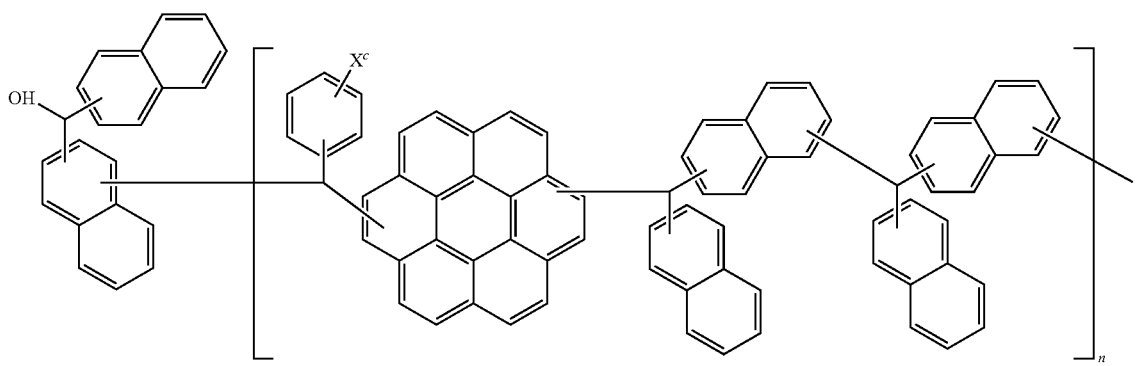

wherein, in the above Chemical Formulae 1-2, 1-3, and 1-4, $X^b$, $X^c$, and $X^d$ are each independently a hydroxy group, a cyano group, a thiol group, an amino group, a halogen, a halogen-containing group, or a combination thereof, and n is an integer of 1 to 10.

8. The hardmask composition as claimed in claim 1, wherein the polymer has a weight average molecular weight of about 1,000 to about 100,000.

9. The hardmask composition as claimed in claim 1, wherein the polymer is included in the composition an amount of about 0.1 to about 30 parts by weight, based on 100 parts by weight of the solvent.

10. A method of forming patterns, the method comprising:
providing a material layer on a substrate,
applying the hardmask composition as claimed in claim 1 on the material layer to form a hardmask layer,
heat-treating the hardmask composition to form a hardmask layer,
forming a silicon-containing thin layer on the hardmask layer,
forming a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching the exposed part of the material layer.

11. The method as claimed in claim 10, wherein applying the hardmask composition includes performing a spin-on coating.

12. The method as claimed in claim 10, wherein heat-treating the hardmask composition to form a hardmask layer includes heat-treating at about 100° C. to about 500° C.

13. The method as claimed in claim 10, further comprising forming a bottom antireflective coating on the silicon-containing thin layer prior to forming the photoresist layer.

14. The method as claimed in claim 10, wherein the silicon-containing thin layer includes silicon oxynitride, silicon oxide, silicon nitride, or a combination thereof.

* * * * *